United States Patent
Xu et al.

(10) Patent No.: US 11,387,426 B2
(45) Date of Patent: Jul. 12, 2022

(54) FLEXIBLE DISPLAY PANEL AND FLEXIBLE DISPLAY DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Shaopeng Xu, Beijing (CN); Hao Wu, Beijing (CN); Xuzhong Liu, Beijing (CN); Na An, Beijing (CN); Zongwei Luo, Beijing (CN); Baolei Guo, Beijing (CN); Gang Ci, Beijing (CN); Xiao Ma, Beijing (CN); Xinfeng Gong, Beijing (CN); Bin Xu, Beijing (CN); Zhenhua Luo, Beijing (CN); Zheng Zhang, Beijing (CN); Qingzhu Guan, Beijing (CN); Wei Su, Beijing (CN); Jinzhao Zhou, Beijing (CN); Guochun Wang, Beijing (CN); Zuoxin Yu, Beijing (CN); Dianzhong Liu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 497 days.

(21) Appl. No.: 16/474,415

(22) PCT Filed: Jan. 17, 2019

(86) PCT No.: PCT/CN2019/072210
§ 371 (c)(1),
(2) Date: Jun. 27, 2019

(87) PCT Pub. No.: WO2019/196532
PCT Pub. Date: Oct. 17, 2019

(65) Prior Publication Data
US 2021/0359251 A1    Nov. 18, 2021

(30) Foreign Application Priority Data
Apr. 12, 2018    (CN) .................. 201820517159.4

(51) Int. Cl.
*H01L 51/52* (2006.01)
*F16D 41/12* (2006.01)

(52) U.S. Cl.
CPC .......... *H01L 51/5237* (2013.01); *F16D 41/12* (2013.01); *H01L 2251/5338* (2013.01)

(58) Field of Classification Search
CPC .................................................. H01L 51/5237
See application file for complete search history.

(56) References Cited

U.S. PATENT DOCUMENTS

| | | |
|---|---|---|
| 2013/0044215 A1 | 2/2013 | Rothkopf et al. |
| 2017/0332497 A1 | 11/2017 | Zhang |
| 2019/0182947 A1 | 6/2019 | Xiang et al. |

FOREIGN PATENT DOCUMENTS

| | | |
|---|---|---|
| CN | 205621366 U | 10/2016 |
| CN | 106297568 A | 1/2017 |

(Continued)

OTHER PUBLICATIONS

International Search Report of PCT/CN2019/072210 in Chinese, dated Mar. 27, 2019, with English translation.

(Continued)

*Primary Examiner* — Vip Patel
(74) *Attorney, Agent, or Firm* — Collard & Roe, P.C.

(57) ABSTRACT

A flexible display panel and a flexible display device are provided. The flexible display panel includes a flexible screen layer and an elastic support layer; the flexible screen (Continued)

layer and the elastic support layer are stacked; the elastic support layer includes a support mechanism and an elastic mechanism, the support mechanism is configured to support the flexible screen layer and is rollable, and the elastic mechanism is configured to generate an anti-rolling elastic force to maintain flatness of the flexible screen layer if the flexible screen layer is unrolled.

18 Claims, 8 Drawing Sheets

(56) References Cited

FOREIGN PATENT DOCUMENTS

| | | |
|---|---|---|
| CN | 206134143 U | 4/2017 |
| CN | 107067981 A | 8/2017 |
| CN | 208014279 U | 10/2018 |

OTHER PUBLICATIONS

Notice of Transmittal of the International Search Report of PCT/CN2019/072210 in Chinese, dated Mar. 27, 2019.

Written Opinion of the International Searching Authority of PCT/CN2019/072210 in Chinese, dated Mar. 27, 2019 with English translation.

FLEXIBLE DISPLAY PANEL AND FLEXIBLE DISPLAY DEVICE

CROSS REFERENCE TO RELATED APPLICATIONS

This application is the National Stage of PCT/CN2019/072210 filed on Jan. 17, 2019, which claims priority under 35 U.S.C. § 119 of Chinese Application No. 201820517159.4 filed on Apr. 12, 2018, the disclosure of which is incorporated by reference.

TECHNICAL FIELD

Embodiments of the present disclosure relate to a flexible display panel and a flexible display device.

BACKGROUND

A flexible screen has developed rapidly in recent years. As compared with a traditional screen, the flexible screen has significant advantages, for example, being thinner and lighter and lower in power consumption. Due to its characteristics of flexibility and bendability, the flexible screen has been widely applied in different fields.

Due to its flexibility, the flexible screen can be easily bent and wound; however, when it needs to be unrolled for use, it cannot be flattened properly, resulting in a certain limitation in using the flexible screen.

SUMMARY

According embodiments of the disclosure, a flexible display panel is provided. The flexible display panel is rollable with respect to a rolling axis and comprises a flexible screen layer and an elastic support layer; in a first direction perpendicular to a direction of the rolling axis, the flexible screen layer and the elastic support layer are stacked; the elastic support layer includes a support mechanism and an elastic mechanism, the support mechanism is configured to support the flexible screen layer and is rollable with respect to the rolling axis, and the elastic mechanism is configured to generate an anti-rolling elastic force to maintain flatness of the flexible screen layer if the flexible screen layer is unrolled.

For example, the support mechanism includes a plurality of supporter units that are sequentially arranged in a second direction perpendicular to the direction of the rolling axis, two adjacent supporter units are flexibly connected with each other, and the second direction is perpendicular to the first direction.

For example, the elastic mechanism is a spring leaf, and the spring leaf is connected between the two adjacent supporter units, so as to generate the anti-rolling elastic force to maintain flatness of the flexible screen layer if the flexible screen layer is unrolled.

For example, each supporter unit includes a through slot passing through the supporter unit in the second direction, and the spring leaf extends in the second direction to pass through the through slot of each supporter unit.

For example, each supporter unit includes one through slot; the elastic mechanism includes a plurality of spring leafs, and the plurality of spring leafs extend in the second direction to pass through the one through slot of each supporter unit.

For example, each supporter unit includes a plurality of through slots; the elastic mechanism includes a plurality of spring leafs, each spring leaf extends in the second direction, and the plurality of spring leafs respectively pass through the plurality of through slots of each supporter unit.

For example, a total support reaction force of a spring leaf group constituted by the plurality of spring leafs satisfies: $F \propto ckR/ph\gamma$, where, k is a correlation coefficient of each spring leaf, a cross section, which is perpendicular to the second direction, of the spring leaf is an arc and R is a curvature radius of the arc, $\gamma$ is a radian of a cross section, which is perpendicular to the direction of the rolling axis, of the spring leaf, h is a thickness of each spring leaf, and p is a total number of spring leafs.

For example, a cross section, which is perpendicular to the direction of the rolling axis, of each supporter unit is trapezoidal; in a state that the flexible screen layer is unrolled, a short edge and a long edge of the trapezoidal cross section of each supporter unit are respectively parallel to the flexible screen layer, an included angle $\beta$ is between two side edges, close to each other, of the trapezoidal cross-sections of the two adjacent supporter units, and $\beta$ satisfies: $\beta > 4\pi/2m_{min} = 2\pi/m_{min}$, where, m is a number of the supporter units of one winding circle in the case that the flexible display panel is in a wound state, and $m_{min}$ is a number of the supporter units of an innermost winding circle in the case that the flexible display panel is in the wound state.

For example, in the second direction perpendicular to the direction of the rolling axis, a total number of the plurality of supporter units satisfies: $n=(L-\Delta L)/l$, where, L is a length of the flexible display panel, $\Delta L$ is a loss length of the flexible display panel, and l is a length of the long edge of the trapezoidal cross-section of the supporter unit.

For example, in the first direction, the flexible screen layer is located on a side of the elastic support layer that is away from the rolling axis.

For example, the flexible display panel further comprises a protective layer provided on a side of the elastic support layer that is away from the flexible screen layer.

For example, the flexible screen layer and the elastic support layer are bonded together by a first soft adhesive layer.

For example, the elastic support layer and the protective layer are bonded together by a second soft adhesive layer.

According to the embodiments of the disclosure, a flexible display device is provided. The display device comprises a casing, a rotating shaft and the flexible display panel as described above. The casing is provided with an opening, the rotating shaft is provided within the casing, the rotating shaft is parallel to the rolling axis, and the flexible display panel is rollable with respect to the rotating shaft, and is stretched out of or retracted into the casing through the opening.

For example, the rotating shaft rotates clockwise or counterclockwise; an edge of the flexible display panel that is parallel to the direction of the rolling axis is fixedly connected with the rotating shaft, so as to implement unrolling or rolling of the flexible display panel when the rotating shaft rotates clockwise or counterclockwise.

For example, the flexible display device further comprises a ratchet mechanism, the ratchet mechanism is provided in the casing and provided on the rotating shaft, and is configured to fix the rotating shaft in the case that the rotating shaft does not need to rotate.

For example, the ratchet mechanism includes a ratchet wheel, a ratchet pawl and a coil spring; the ratchet wheel is fixed to the rotating shaft by the coil spring, the coil spring is configured for providing a reverse rotary force to the ratchet wheel, the ratchet pawl is fixed to the casing, and a ratchet tooth on the ratchet wheel is engaged with the ratchet pawl under an action of the reverse rotary force.

For example, the casing is provided thereon with a button, the button is connected with the ratchet pawl through a linkage structure; and if the button is pressed down, the linkage structure pushes the ratchet pawl to separate the ratchet pawl from the ratchet tooth on the ratchet wheel.

For example, the ratchet mechanism is provided at an end portion of the rotating shaft, and the flexible display panel is wound around a portion of the rotating shaft except for the end portion provided with the ratchet mechanism.

For example, in addition to the edge of the flexible display panel that is fixedly connected with the rotating shaft, the flexible display panel further comprises three non-fixed edges that are not fixed to the rotating shaft, an outer side of the three non-fixed edges are respectively provided with a barrier wall, and one edge of the three non-fixed edges that is away from the rotating shaft is provided with a stop structure.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
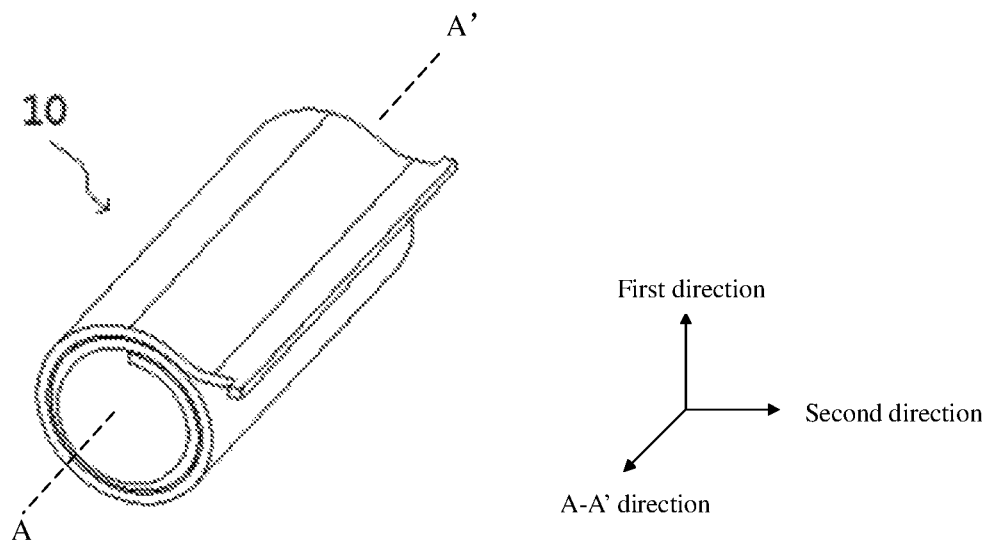
FIG. 1 is a structural schematic diagram of a flexible display panel in a wound state provided by embodiments of the present disclosure.

In order to make objects, technical details and advantages of the embodiments of the disclosure apparent, the technical solutions of the embodiments will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

Unless otherwise defined, the technical terms or scientific terms here should be of general meaning as understood by those ordinarily skilled in the art. In the descriptions and claims of the present disclosure, expressions such as "first", "second" and the like do not denote any order, quantity, or importance, but rather are used for distinguishing different components. Expressions such as "include" or "comprise" and the like denote that elements or objects appearing before the words of "include" or "comprise" cover the elements or the objects enumerated after the words of "include" or "comprise" or equivalents thereof, not exclusive of other elements or objects. Expressions such as "up", "down", "left", "right" and the like are only used for expressing relative positional relationship, the relative positional relationship may be correspondingly changed in the case that the absolute position of a described object is changed.

Embodiments of the present disclosure provide a flexible display panel, which is capable of being better unrolled to achieve a flat state.

As shown in FIG. 1 to FIG. 6, the flexible display panel 10 is rollable with respect to a rolling axis A-A'; the flexible display panel 10 comprises a flexible screen layer 11 and an elastic support layer 12; in a first direction perpendicular to a direction of the rolling axis A-A', the flexible screen layer 11 and the elastic support layer 12 are stacked; and the elastic support layer 12 includes a support mechanism and an elastic mechanism. For example, the flexible screen layer 11 is used to implement a display function. For example, the support mechanism is configured to support the flexible screen layer 11 and is rollable with respect to the rolling axis A-A'. For example, the elastic mechanism is configured to generate an anti-rolling elastic force to maintain flatness of the flexible screen layer 11 if the flexible screen layer 11 is unrolled.

It should be noted that, in the embodiments of the present disclosure, there is a certain difference between "rolling" and "winding". For example, "winding" refers to that the flexible display panel 10 is curved to form one circle or a plurality of concentric circles, while "rolling" refers to that the flexible display panel 10 forms a curved portion, not necessarily forms a circle. Therefore, "winding" is an example of "rolling", and accordingly, a "winding axis" is an example of the "rolling axis".

For example, as shown in FIG. 1 to FIG. 6, in the first direction perpendicular to the direction of the rolling axis A-A', the flexible screen layer 11 is provided on a side of the elastic support layer 12 that is away from the rolling axis A-A'. However, the embodiments of the present disclosure is not limited thereto, and for example, in the first direction perpendicular to the direction of the rolling axis A-A', the flexible screen layer 11 is provided on a side of the elastic support layer 12 that is close to the rolling axis A-A'.

In the flexible display panel provided by the embodiments of the present disclosure, by providing the elastic support layer, an unrolled portion of the flexible screen layer is straight, flat and stable. The elastic support layer is provided, so that a rolling performance of the flexible display panel is guaranteed on the one hand, and stable support and surface flatness are maintained in the case that the flexible display panel is unrolled on the other hand.

For example, as shown in FIG. 1 to FIG. 6, the support mechanism includes a plurality of supporter units 121 (for example, pillow units) that are sequentially arranged in a second direction perpendicular to the direction of the rolling axis A-A', and two adjacent supporter units 121 are flexibly connected with each other in the second direction, so that the plurality of supporter units 121 support the flexible screen layer 11 in the case that the flexible screen layer 11 is unrolled, and the plurality of supporter units 121 do not impede rolling of the flexible screen layer 11 in the case that the flexible screen layer 11 needs to be rolled. For example, every two adjacent supporter units 121 are flexibly connected with each other. For example, the second direction is perpendicular to the above-described first direction.

For example, each supporter unit 121 is made of a hard material having certain strength, for example, metal, hard plastic, other composite material, and the like.

Figure 7:
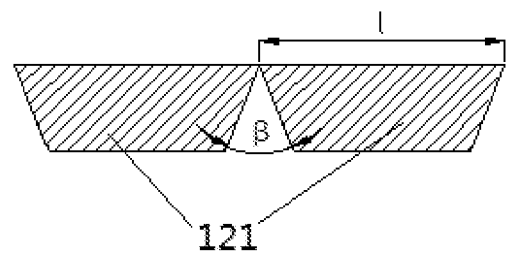
FIG. 7 is a structural schematic diagram of a cross section, which is perpendicular to the direction of the winding axis, of two adjacent supporter units in the flexible display panel provided by the embodiments of the present disclosure.

For example, as shown in FIG. 7, a cross section of each supporter unit 121 that is perpendicular to the direction of the rolling axis A-A' is trapezoidal, and in the case that the flexible screen layer 11 is unrolled, a short edge and a long edge of the trapezoidal cross section of each supporter unit 121 are respectively parallel to the flexible screen layer 11. For example, the long edges of the trapezoidal cross sections of the plurality of supporter units 121 are connected sequentially without a space between the long edges of the trapezoidal cross sections of every two adjacent supporter units 121.

For example, as shown in FIG. 1 to FIG. 6, in the first direction perpendicular to the direction of the rolling axis A-A', the flexible screen layer 11 is provided on the side of the elastic support layer 12 that is away from the rolling axis A-A'; in this case, the short edge of the trapezoidal cross section of each supporter unit 121 is provided on the side away from the flexible screen layer 11, and the long edge of the trapezoidal cross section of each supporter unit 121 is provided on the side close to the flexible screen layer 11, to ensure that the plurality of supporter units 121 do not interfere with one another in the wound state.

For example, in the first direction perpendicular to the direction of the rolling axis A-A', the flexible screen layer 11 is provided on the side of the elastic support layer 12 that is close to the rolling axis A-A'; in this case, the short edge of the trapezoidal cross section of each supporter unit 121 is provided on the side close to the flexible screen layer 11, and the long edge of the trapezoidal cross section of each supporter unit 121 is provided on the side away from the flexible screen layer 11, to ensure that the plurality of supporter units 121 do not interfere with one another in the wound state.

For example, with reference to FIG. 7, in the case that the flexible screen layer 11 is unrolled, an included angle $\beta$ is between two side edges, close to each other, of the trapezoidal cross-sections of two adjacent supporter units 121, and $\beta$ satisfies:

$$\beta > 4\pi/2m_{min} = 2\pi/m_{min}$$

Figure 2:
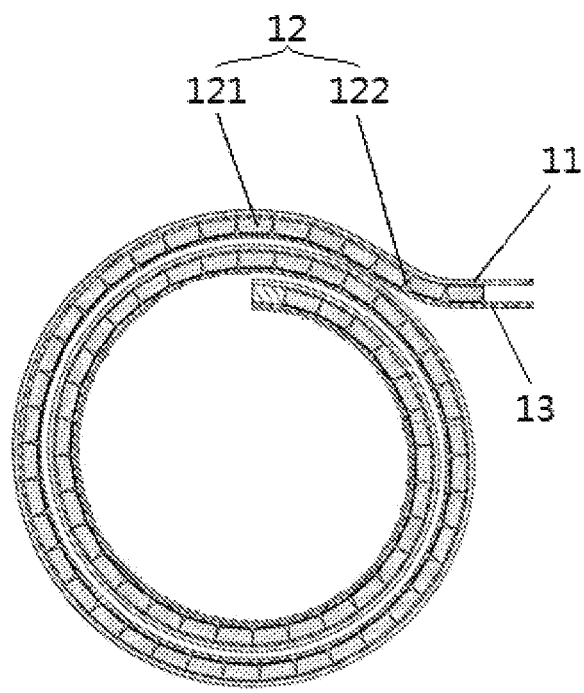
FIG. 2 is a structural schematic diagram of a cross section, which is perpendicular to a direction of a winding axis, of the flexible display panel in the wound state provided by the embodiments of the present disclosure.

Where, in combination with FIG. 2, m is a number of the supporter units 121 of one winding circle in the case that the flexible display panel 10 is in the wound state; and $m_{min}$ is a number of the supporter units 121 of an innermost winding circle in the case that the flexible display panel is in the wound state.

For example, as shown in FIG. 7, in the second direction perpendicular to the direction of the rolling axis A-A', a total number of the plurality of supporter units 121 satisfies:

$$n = (L - \Delta L)/l$$

Where, L is a length of the flexible display panel 10, $\Delta L$ is a loss length of the flexible display panel 10 (for example, a length of a portion, fixed on a protective rubber frame, of the flexible display panel 10, etc.), and l is a length of the long edge of each supporter unit 121.

For example, a cross section of each supporter unit 121 that is perpendicular to the direction of the rolling axis A-A' is an isosceles trapezoid, to further improve uniformity and stability of the support mechanism.

For example, with reference to FIG. 2 to FIG. 6, the elastic mechanism is a spring leaf 122, and the spring leaf 122 is connected between two adjacent supporter units 121, to generate the anti-rolling elastic force so as to maintain flatness of the flexible screen layer 11 if the flexible screen layer 11 is unrolled. For example, the spring leaf 122 is connected between every two adjacent supporter units 121 in the second direction.

For example, each supporter unit 121 includes a through slot 1210 passing through the supporter unit 121 in the second direction, and the spring leaf 122 passes through the through slot 1210 so as to be connected between two adjacent supporter units 121 in the second direction.

Figure 5:
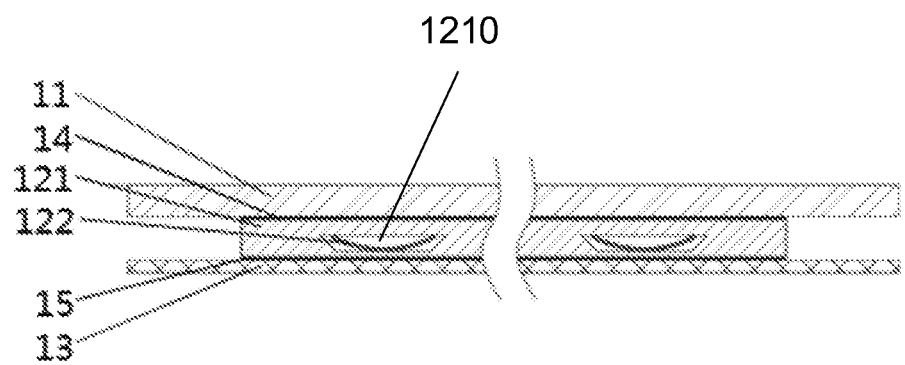
FIG. 5 is a structural schematic diagram of a cross section, which is perpendicular to a second direction, of the flexible display panel in the unrolled state provided by the embodiments of the present disclosure.

For example, the spring leaf 122 extends in the second direction to pass through the through slot 1210 of each supporter unit 121 so that the spring leaf 122 and the plurality of supporter units 121 are combined to form the elastic support layer 12, and the flexible screen layer 11 is provided on the elastic support layer 12. On the one hand, because the spring leaf 122 is provided within the supporter unit 121, a thickness of the elastic support layer 12 is reduced, so as to reduce an overall thickness of the flexible display panel 10; on the other hand, because the spring leaf 122 is provided in a manner of passing through the plurality of supporter units 121, the spring leaf 122 links together to a certain extent the plurality of supporter units 121 that are originally independent of one another, so that the plurality of supporter units 121 are not easily separated from one another, and structure stability of the elastic support layer 12 is enhanced. For example, FIG. 5 is a structural schematic diagram of a cross section, which is perpendicular to the second direction, of the flexible display panel in the unrolled state provided by the embodiments of the present disclosure, and it is clearly seen from FIG. 5 that the spring leaf 122 is provided in the through slot 1210 of the supporter unit 121. Further, as shown in FIG. 5, in the state where the flexible display panel 10 is unrolled, a cross section, which is perpendicular to the second direction, of the spring leaf 122 is an arc, and the arc has a curvature radius of R. Because the cross section, which is perpendicular to the second direction, of the spring leaf 122 is set to be the arc in the state that the flexible display panel 10 is unrolled, on the one hand, a curvature of the arc is reduced during a process of rolling the flexible display panel 10 to release a portion of a rolling stress, so that the rolling process proceeds more smoothly, on the other hand, the curvature of the arc is restored during a process of unrolling the flexible display panel 10 from the rolled state, so that a larger support reaction force is generated to maintain flatness of the flexible display panel 10.

It should be noted that, an example that the spring leaf 122 passes through the supporter unit 121 is provided in the embodiments of the present disclosure; however, the embodiments of the present disclosure are not limited thereto, and the elastic mechanism may be formed separately and independent of the support mechanism, which also achieves the same purpose.

For example, each supporter unit 121 includes only one through slot 1210, the elastic mechanism includes a plurality of spring leafs 122, and the plurality of spring leafs 122 all extend in the second direction to pass through the only one through slot 1210 of each supporter unit 121.

Figure 6:
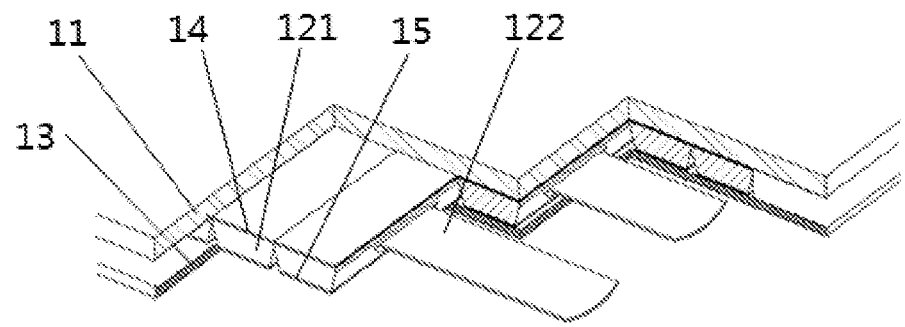
FIG. 6 is a structural schematic diagram of a partial cross section of the flexible display panel in the unrolled state provided by the embodiments of the present disclosure.

For example, as shown in FIG. 5 to FIG. 6, each supporter unit 121 includes a plurality of through slots 1210, the elastic mechanism includes a plurality of spring leafs 122, each spring leaf 122 extends in the second direction, and the plurality of spring leafs 122 respectively pass through the plurality of through slots of each supporter unit 121.

Figure 8:
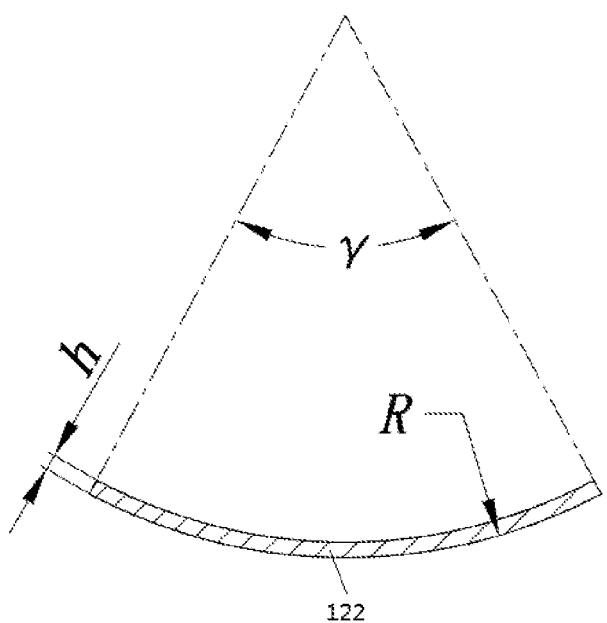
FIG. 8 is a structural schematic diagram of a cross section, which is perpendicular to the direction of the winding axis, of a spring leaf in the flexible display panel provided by the embodiments of the present disclosure.

For example, as shown in FIG. 8, a total support reaction force of a spring leaf group constituted by the plurality of spring leafs 122 satisfies:

$$F \propto kR/ph\gamma$$

Where, k is a correlation coefficient of each spring leaf 122, which is determined by a material of the spring leaf 122 itself, R is the curvature radius of the arc-shaped cross section, which is perpendicular to the second direction, of the spring leaf 122, γ is a radian of the cross section, which is perpendicular to the direction of the rolling axis, of the spring leaf 122, h is a thickness of each spring leaf 122, and p is the number of spring leafs 122.

Thus, in the case that the flexible display panel 10 is unrolled from the rolled state, the spring leaf group relies on the support reaction force of its own spring leafs to maintain the straight, flat and stable state of the flexible display panel 10. Meanwhile, according to the above-described calculation formula, the spring leaf 122 and the number of spring leafs 122 used may be selected according to actual needs.

Figure 3A:
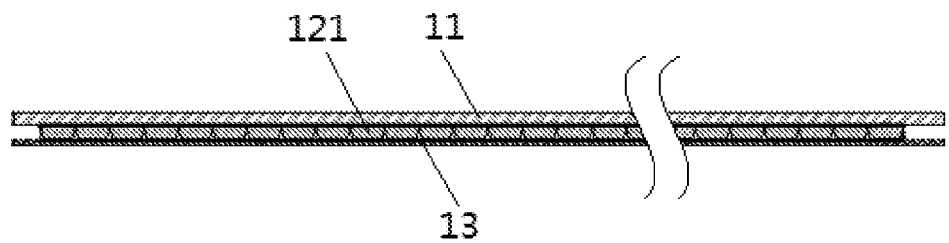
FIG. 3(a) is a structural schematic diagram of the cross section, which is perpendicular to the direction of the winding axis, of the flexible display panel in an unrolled state provided by the embodiments of the present disclosure.
Figure 3B:
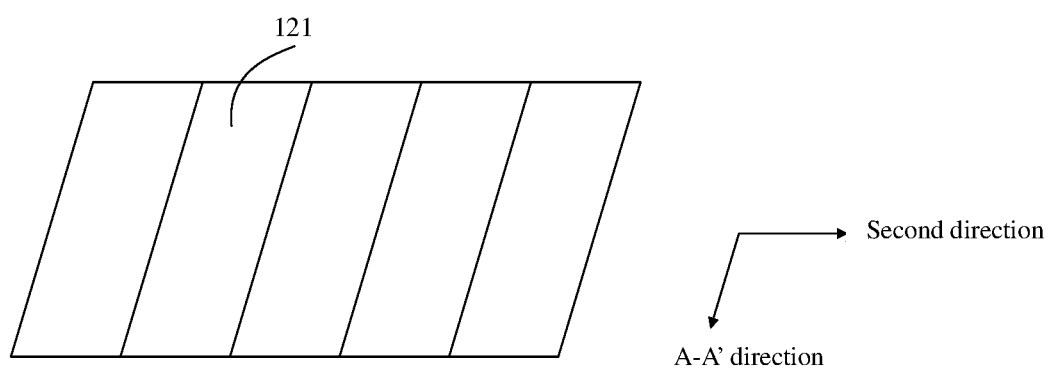
FIG. 3(b) is a top view of a plurality of supporter units of the flexible display panel in the unrolled state provided by the embodiments of the present disclosure.

For example, as shown in FIG. 3(b), the plurality of supporter units 121 are sequentially arranged in the second direction perpendicular to the direction of the rolling axis A-A', and each supporter unit 121 extends continuously from one end of the flexible screen layer 11 to the other end of the flexible screen layer 11 in the direction of the rolling axis A-A'; and in this case, the flexible screen layer 11 is supported more stably.

Figure 3C:
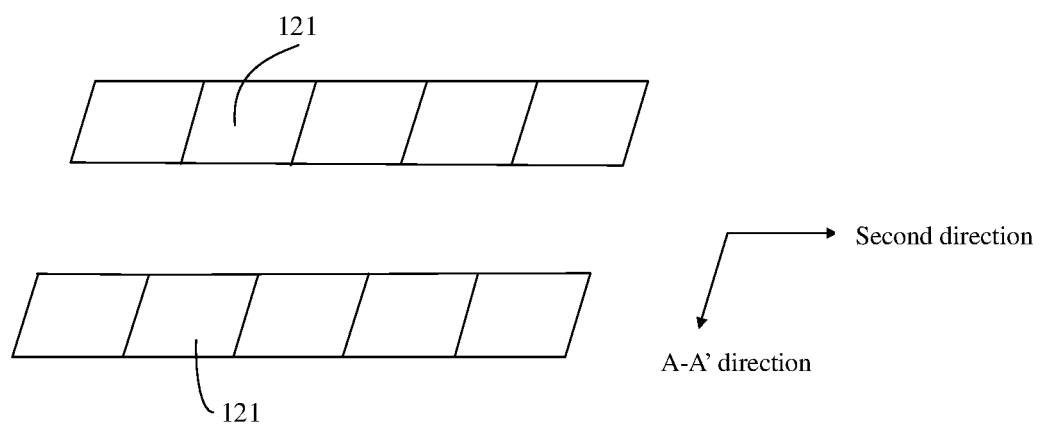
FIG. 3(c) is another top view of the plurality of supporter units of the flexible display panel in the unrolled state provided by the embodiments of the present disclosure.

For example, as shown in FIG. 3(c), the plurality of supporter units 121 are sequentially arranged in the second direction perpendicular to the direction of the rolling axis A-A' to constitute a repeating unit, the repeating unit is arranged repeatedly in the direction of the rolling axis A-A'; and in this case, a size requirement for each supporter unit 121 is lowered, which reduces a fabrication difficulty. For example, two adjacent repeating units are spaced apart from each other.

For example, as shown in FIG. 2 to FIG. 6, the flexible display panel 10 further comprises a protective layer 13, and the protective layer 13 is provided on a side of the elastic support layer 12 that is away from the flexible screen layer 11. The protective layer 13 protects the flexible screen layer 11 in the wound state, and prevent any structures between two adjacent winding circles from scratching a surface of the flexible screen layer 11.

Figure 4:
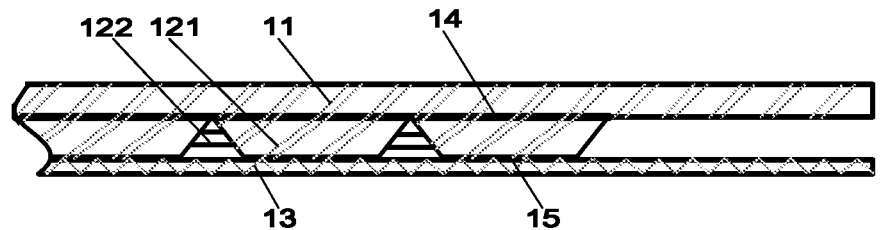
FIG. 4 is an enlarged structural schematic diagram of the cross section, which is perpendicular to the direction of the winding axis, of the flexible display panel in the unrolled state provided by the embodiments of the present disclosure.

For example, as shown in FIG. 4 to FIG. 6, the flexible screen layer 11 and the elastic support layer 12 are bonded together by a first soft adhesive layer 14. For example, the first soft adhesive layer 14 is a double-sided viscous layer, which bonds the flexible screen layer 11 and the elastic support layer 12 (which may be, specifically, the supporter units 121) together, and meanwhile, the first soft adhesive layer 14 has a certain buffer function, and eliminates influence on a display effect of the flexible screen layer 11 due to unevenness of a surface of the supporter unit 121 or unevenness of a surface of a joint between two adjacent supporter units 121.

For example, as shown in FIG. 4 to FIG. 6, the elastic support layer 12 and the protective layer 13 are bonded together by a second soft adhesive layer 15, and the second soft adhesive layer 15 is a viscous layer for bonding the protective layer 13 and the elastic support layer 12. For example, one side of the protective layer 13 is adhered to the second soft adhesive layer 15 so that no relative offset occurs between the elastic support layer 12 and the protective layer 13, and the other side of the protective layer 13 is soft and has micro-elasticity, for example, is made of a foam, a non-viscous colloidal material, etc.

For example, the flexible display panel is an Organic Light-Emitting Diode (OLED) display panel.

Embodiments of the present disclosure further proposes a flexible display device, which comprises the flexible display panel and better implements unrolling of the flexible display panel to achieve the flat state.

Figure 9:
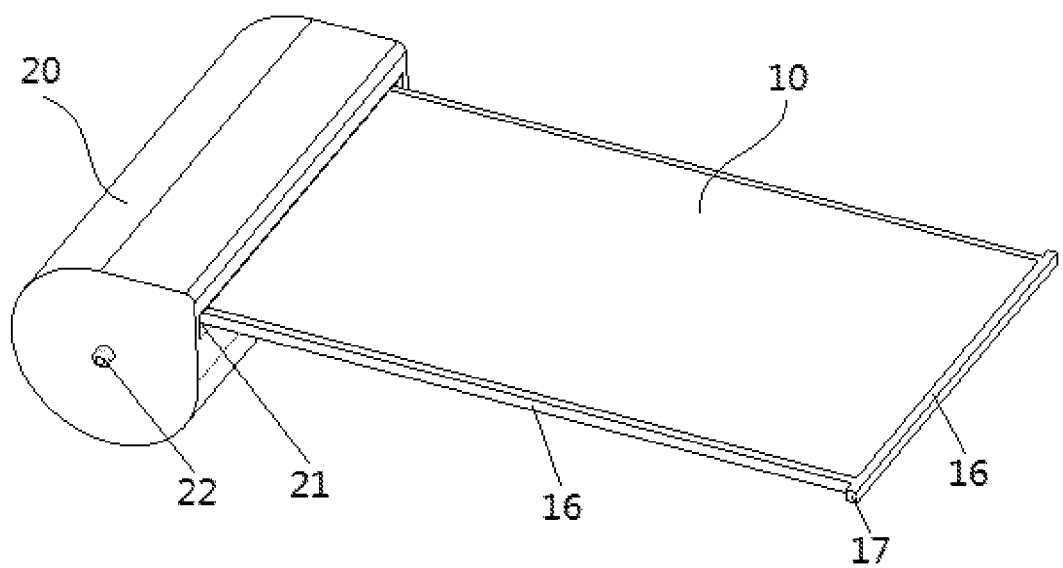
FIG. 9 is a structural schematic diagram of the flexible display panel in the unrolled state in a flexible display device provided by the embodiments of the present disclosure.
Figure 10:
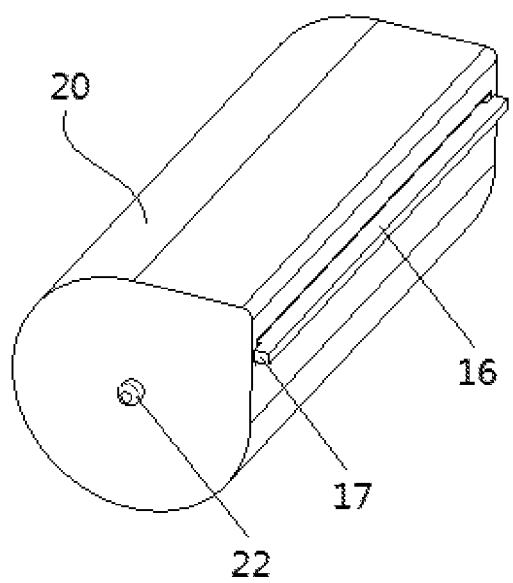
FIG. 10 is a structural schematic diagram of the flexible display panel in the wound state in the flexible display device provided by the embodiments of the present disclosure.
Figure 11:
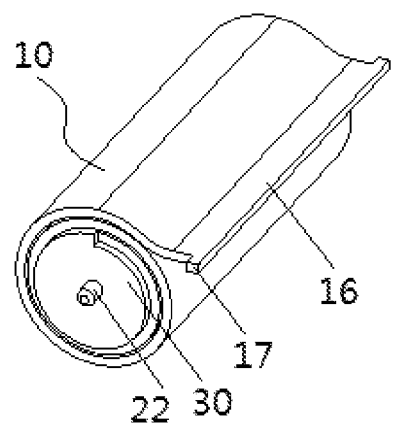
FIG. 11 is a structural schematic diagram of the flexible display panel in the wound state in the flexible display device after a casing is removed provided by the embodiments of the present disclosure.

As shown in FIG. 9 to FIG. 11, the flexible display device comprises a casing 20, a rotating shaft 30 and the flexible display panel 10; the casing 20 is provided with an opening 21, the rotating shaft 30 is provided in the casing 20, the rotating shaft 30 is parallel to the above-described rolling axis A-A', and the flexible display panel 10 is rollable with respect to the rotating shaft 30, and is stretched out of or retracted into the casing 20 through the opening 21.

With reference to FIG. 2, the flexible display panel 10 comprises the flexible screen layer 11 and the elastic support layer 12; in the first direction perpendicular to the direction of the rolling axis A-A', the flexible screen layer 11 and the elastic support layer 12 are stacked; the elastic support layer 12 includes the support mechanism and the elastic mechanism. For example, the flexible screen layer 11 is used to implement the display function. For example, the support mechanism is configured to support the flexible screen layer 11 and is rollable with respect to the rolling axis A-A'. For example, the elastic mechanism is configured to generate the anti-rolling elastic force to maintain flatness of the flexible screen layer 11 in the case that the flexible screen layer 11 is unrolled.

In the flexible display device provided by the embodiments of the present disclosure, by providing the casing, the rotating shaft and the flexible display panel, the flexible display panel is wound on the rotating shaft and accommodated in the casing, which, thus, facilitates use of the display device and has a better portable performance. Meanwhile, by providing the elastic support layer in the flexible display panel, an unrolled portion of the flexible screen layer is straight, flat and stable; in this way, on the one hand, a curling performance of the flexible display panel is ensured, and on the other hand, stable support and surface flatness are maintained in the case that the flexible display panel is unrolled.

It should be noted that, the display device according to the embodiments of the present disclosure may be: an E-paper, a mobile phone, a tablet personal computer, a television, a laptop, a digital photo frame, a navigator, and any other product or component having a display function.

For example, with reference to FIG. 11, the rotating shaft 30 rotates clockwise or counterclockwise; an edge of the flexible display panel 10 that is parallel to the direction of the rolling axis A-A' is fixedly connected with the rotating shaft 30, so as to implement unrolling or rolling of the flexible display panel 10 when the rotating shaft 30 rotates clockwise or counterclockwise. Here, clockwise or counterclockwise rotation of the rotating shaft 30 for example is driven by a motor, or is driven by the flexible display panel 10 in the case that the flexible display panel 10 is pulled by an external force.

Figure 12:
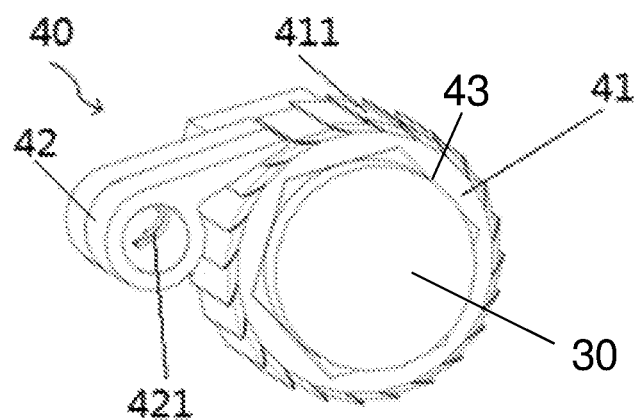
FIG. 12 is a structural schematic diagram of a ratchet mechanism in the flexible display device provided by the embodiments of the present disclosure.
Figure 13:
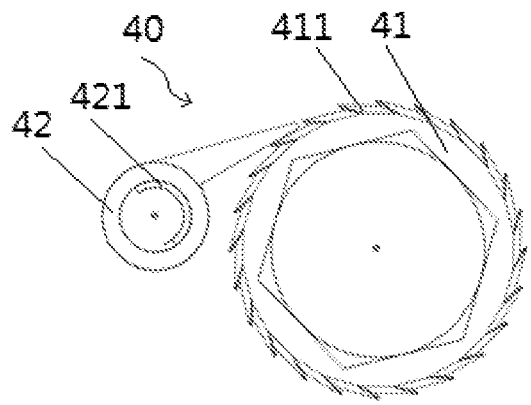
FIG. 13 is another structural schematic diagram of the ratchet mechanism in the flexible display device provided by the embodiments of the present disclosure.

For example, as shown in FIG. 12 and FIG. 13, the flexible display device further comprises a ratchet mechanism 40, the ratchet mechanism 40 is provided in the casing 20 and provided on the rotating shaft 30, and is configured to fix the rotating shaft 30 in the case that the rotating shaft 30 does not need to rotate, so that the flexible display panel 10 is maintained stable. For example, in the case that the flexible display panel 10 is stretched out to a certain position, the position of the flexible display panel 10 is maintained unchanged by using a unidirectional rotation performance of the ratchet mechanism 40. Thus, by providing the ratchet mechanism 40, the flexible display panel 10 is fixed in position in any unrolled state (accuracy depends on the number of ratchet teeth) without being retracted into the casing 20.

For example, with reference to FIG. 11 to FIG. 13, the ratchet mechanism 40 includes a ratchet wheel 41, a ratchet pawl 42 and a coil spring 43; the ratchet wheel 41 is fixed to the rotating shaft 30 by the coil spring 43, the coil spring 43 is used for providing a reverse rotary force to the ratchet wheel 41, the ratchet pawl 42 is fixed to the casing 20 (for example, an inner wall of the casing 20), and a ratchet tooth 411 on the ratchet wheel 41 is engaged with the ratchet pawl 42 under an action of the reverse rotary force, so as to maintain the position of the flexible display panel 10 unchanged. In the case that the ratchet pawl 42 is separated from the ratchet tooth 411 on the ratchet wheel 41, the reverse rotary force provided by the coil spring 43 makes the rotating shaft 30 to rotate, so that the flexible display panel 10 is wound and retracted.

For example, as shown in FIG. 9 to FIG. 11, FIG. 14 and FIG. 15, the casing 20 is provided thereon with a button 22, the button 22 is connected with the ratchet pawl 42 through a linkage structure; and if the button 22 is pressed down, the linkage structure pushes the ratchet pawl 42 to separate the ratchet pawl 42 from the ratchet tooth 411. In this way, the button 22 controls the ratchet pawl 42 to release the ratchet tooth 411, so that the ratchet wheel 41 rotates and drives the rotating shaft 30 to rotate, to complete automatic winding and retraction of the flexible display panel 10. For example, the linkage mechanism has an end portion that is cooperated with a protrusion 421 (shown in FIG. 12 and FIG. 13) provided on the ratchet pawl 42; in the case that the button 22 is pressed down, the end portion of the linkage mechanism pushes the protrusion 421 to cause the ratchet pawl 42 to rotate and separate from the ratchet tooth 411, and at the same time, the ratchet wheel 41 rotates under the action of the reverse rotary force of the coil spring 43 so as to implement automatic winding and retraction of the flexible display panel 10.

For example, as shown in FIG. 9, and FIG. 14 to FIG. 18, in addition to the edge of the flexible display panel 10 that is fixedly connected with the rotating shaft 30, the flexible display panel 10 further comprises three non-fixed edges that are not fixed to the rotating shaft 30, an outer side of the three non-fixed edges are respectively provided with a barrier wall 16, and one edge of the three non-fixed edges that is away from the rotating shaft 30 is provided with a stop structure 17. Thus, by providing the barrier wall 16, the edges of the flexible display panel 10 are protected by the barrier wall 16; and by providing the stop structure 17, the flexible display panel 10 is stopped at an extreme position if being wound and retracted, to prevent the flexible display panel 10 from being excessively wound into the interior of the casing 20. For example, as shown in FIG. 14 to FIG. 18, the stop structure 17 is a protrusion provided on the barrier wall 16, and it can be known that, in addition to such implementation mode, other structure that implements the same function may also be used as the stop structure according to the embodiments of the present disclosure, the structure of which is not limited to the protrusion.

For example, as shown in FIG. 9, and FIG. 14 to FIG. 18, a portion of the barrier wall 16 is interposed between the flexible screen layer 11 and the protective layer 13 for achieving a protection function. For example, one end, which is close to the rotating shaft 30, of the barrier wall 16 of two opposite non-fixed edges is connected with the rotating shaft 30, so that the barrier wall 16 of the two opposite non-fixed edges is stretched or retracted simultaneously with the flexible display panel 10.

For example, various components (for example, a motherboard, a radio frequency, etc.) as well as a battery may be integrated inside the rotating shaft 30, so that the flexible display device is easily carried and used.

For example, in addition to the above-described ratchet mechanism 40, a mode for stretching or retracting the flexible display panel 10 may be that: a micro motor rotates to drive the rotating shaft to rotate, so as to implement an automatic stretching or retracting function of the flexible display panel 10; during operation, the flexible display panel 10 may be stretched or retracted around the shaft by pressing a specific button or performing a gesture operation directly on a screen.

For example, the ratchet mechanism 40 is provided at an end portion of the rotating shaft 30, and the flexible display panel 10 is wound around a portion of the rotating shaft 30 except for the end portion provided with the ratchet mechanism 40. In this way, the ratchet mechanism 40 is prevented from damaging the flexible display panel 10.

For example, with reference to FIG. 14 to FIG. 18, the support mechanism includes the plurality of supporter units 121 (for example, pillow units) that are sequentially arranged in the second direction perpendicular to the direction of the rolling axis A-A', and two adjacent supporter units 121 are flexibly connected with each other in the second direction, so that the plurality of supporter units 121 support the flexible screen layer 11 in the case that the flexible screen layer 11 is unrolled, and the plurality of supporter units 121 do not impede rolling of the flexible screen layer 11 in the case that the flexible screen layer 11 needs to be rolled.

For example, each supporter unit 121 is made of the hard material having certain strength, for example, metal, hard plastic, other composite material, and the like.

For example, as shown in FIG. 7, the cross section of each supporter unit 121 that is perpendicular to the direction of the rolling axis A-A' is trapezoidal, and in the state that the flexible screen layer 11 is unrolled, the short edge and the long edge of the trapezoidal cross section of each supporter unit 121 are respectively parallel to the flexible screen layer 11. For example, the long edges of the trapezoidal cross sections of the plurality of supporter units 121 are connection sequentially without a space between the long edges of the trapezoidal cross sections of every two adjacent supporter units 121.

For example, in the case that the flexible screen layer 11 is unrolled, the included angle β is between two side edges, close to each other, of the trapezoidal cross-sections of two adjacent supporter units 121, and β satisfies:

$$\beta > 4\pi/2m_{min} = 2\pi/m_{min}$$

Figure 14:
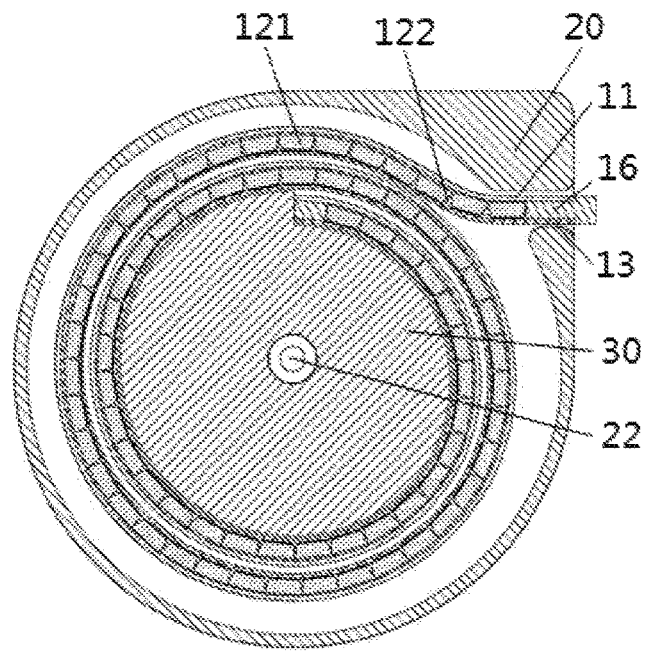
FIG. 14 is a structural schematic diagram of a cross section, which is perpendicular to the direction of the winding axis, of the flexible display device provided by the embodiments of the present disclosure in the case that the flexible display panel is in the wound state.
Figure 15:
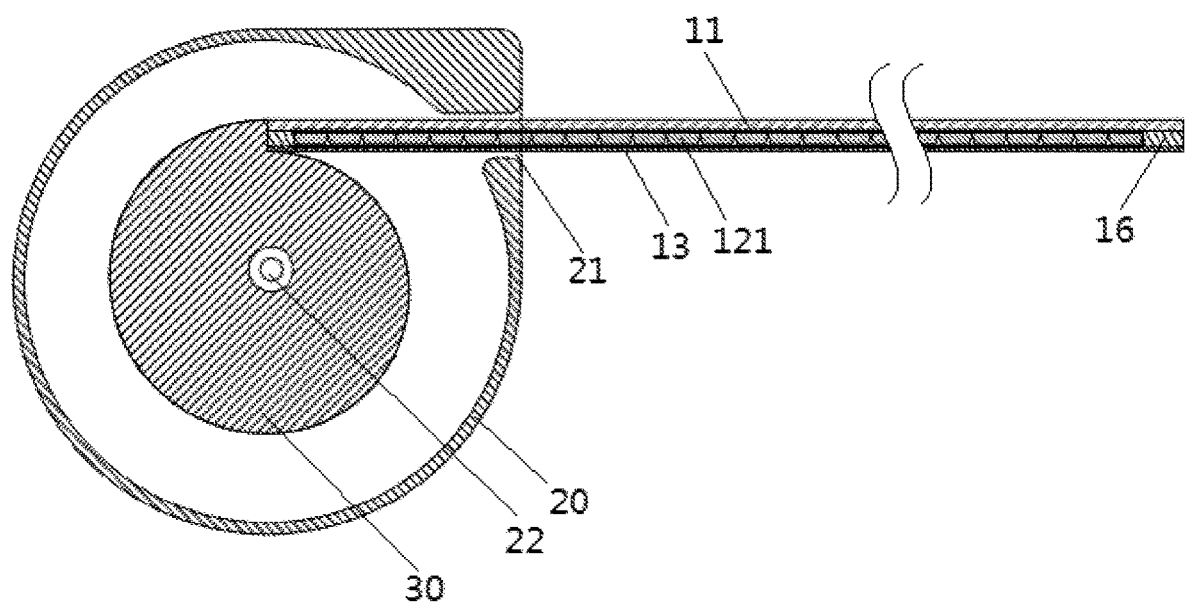
FIG. 15 is a structural schematic diagram of the cross section, which is perpendicular to the direction of the winding axis, of the flexible display device provided by the embodiments of the present disclosure in the case that the flexible display panel is in the unrolled state.

Where, in combination with FIG. 14, m is the number of the supporter units 121 of one winding circle in the case that the flexible display panel 10 is in the wound state; and $m_{min}$ is the number of the supporter units 121 of the innermost winding circle in the case that the flexible display panel is in the wound state.

For example, as shown in FIG. 7, in the second direction perpendicular to the direction of the rolling axis A-A', the total number of the plurality of supporter units 121 satisfies:

$$n = (L - \Delta L)/l$$

Where, L is the length of the flexible display panel 10, ΔL is the loss length of the flexible display panel 10 (for example, a length of a portion, fixed on a protective rubber frame, of the flexible display panel 10, etc.), and 1 is the length of the long edge of each supporter unit 121.

For example, with reference to FIG. 14 to FIG. 18, the elastic mechanism is the spring leaf 122, and the spring leaf 122 is connected between two adjacent supporter units 121, to generate the anti-rolling elastic force so as to maintain flatness of the flexible screen layer 11 in the case that the flexible screen layer 11 is unrolled.

For example, each supporter unit 121 includes the through slot 1210 passing through the supporter unit 121 in the second direction, and the spring leaf 122 passes through the through slot 1210 so as to be connected between two adjacent supporter units 121 in the second direction.

For example, the spring leaf 122 extends in the second direction to pass through the through slot 1210 of each supporter unit 121 so that the spring leaf 122 and the plurality of supporter units 121 are combined to form the elastic support layer 12, and the flexible screen layer 11 is provided on the elastic support layer 12. On the one hand, because the spring leaf 122 is provided within the supporter unit 121, the thickness of the elastic support layer 12 is reduced, so as to reduce the overall thickness of the flexible display panel 10; on the other hand, because the spring leaf 122 is provided in the manner of passing through the plurality of supporter units 121, the spring leaf 122 links together to a certain extent the plurality of supporter units 121 that are originally independent of one another, so that the plurality of supporter units 121 are not easily separated from one another, and structural stability of the elastic support layer 12 is enhanced.

It should be noted that, an example that the spring leaf 122 passes through the supporter unit 121 is provided in the embodiments of the present disclosure; however, the embodiments of the present disclosure are not limited thereto, and the elastic mechanism may be formed separately and independent of the support mechanism, which may achieve the same purpose.

For example, each supporter unit 121 includes only one through slot 1210, the elastic mechanism includes the plurality of spring leafs 122, and the plurality of spring leafs 122 all extend in the second direction to pass through the only one through slot 1210 of each supporter unit 121.

For example, as shown in FIG. 5 to FIG. 6, each supporter unit 121 includes the plurality of through slots 1210, the elastic mechanism includes the plurality of spring leafs 122, each spring leaf 122 extends in the second direction, and the plurality of spring leafs 122 respectively pass through the plurality of through slots of each supporter unit 121.

For example, as shown in FIG. 8, the total support reaction force of the spring leaf group constituted by the plurality of spring leafs 122 satisfies:

$$F \propto kR/ph\gamma$$

Where, k is the correlation coefficient of each spring leaf 122, which is determined by the material of the spring leaf 122 itself, R is the curvature radius of the arc-shaped cross section, that is perpendicular to the second direction, of the spring leaf 122, γ is the radian of the cross section, that is perpendicular to the direction of the rolling axis, of the spring leaf 122, h is the thickness of each spring leaf 122, and p is the number of spring leafs 122.

Thus, in the case that the flexible display panel 10 is unrolled from the rolled state, the spring leaf group relies on the support reaction force of its own spring leafs to maintain the straight, flat and stable state of the flexible display panel 10. Meanwhile, according to the above-described calculation formula, the spring leaf 122 and the number of spring leafs 122 used may be selected according to actual needs.

For example, as shown in FIG. 14 to FIG. 18, the flexible display panel 10 further comprises the protective layer 13, and the protective layer 13 is provided on the side of the elastic support layer 12 that is away from the flexible screen layer 11. The protective layer 13 protects the flexible screen layer 11 in the wound state, and prevent any structures between adjacent winding circles from scratching the surface of the flexible screen layer 11.

Figure 16:
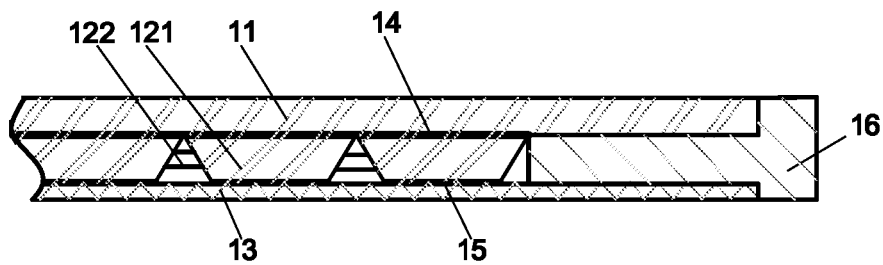
FIG. 16 is an enlarged structural schematic diagram of the cross section, which is perpendicular to the direction of the winding axis, of the flexible display device provided by the embodiments of the present disclosure in the case that the flexible display panel is in the unrolled state.
Figure 17:
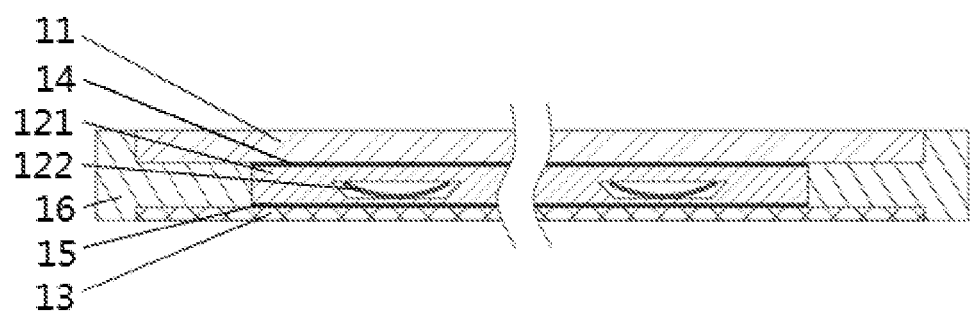
FIG. 17 is a structural schematic diagram of a cross section, which is perpendicular to the second direction, of the flexible display panel in the flexible display device provided by the embodiments of the present disclosure.
Figure 18:
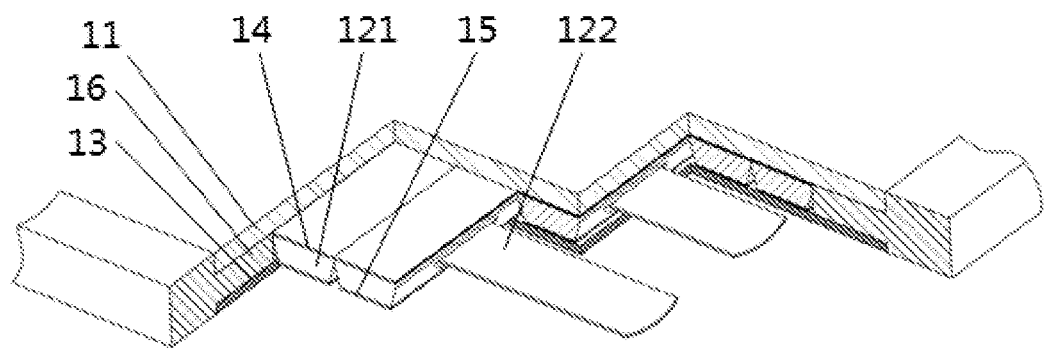
FIG. 18 is a structural schematic diagram of a partial cross section of the flexible display panel in the unrolled state in the flexible display device provided by the embodiment of the present disclosure.

For example, as shown in FIG. 16 to FIG. 18, the flexible screen layer 11 and the elastic support layer 12 are bonded together by the first soft adhesive layer 14. For example, the first soft adhesive layer 14 is the double-sided viscous layer, which bonds the flexible screen layer 11 and the elastic support layer 12 (which may be, specifically, the supporter units 121) together, and meanwhile, the first soft adhesive layer 14 has a certain buffer function, and eliminates influence on the display effect of the flexible screen layer 11 due to unevenness of the surface of the supporter unit 121 or unevenness of the surface of the joint between two adjacent supporter units 121.

For example, as shown in FIG. 16 to FIG. 18, the elastic support layer 12 and the protective layer 13 are bonded together by the second soft adhesive layer 15, and the second soft adhesive layer 15 is the viscous layer for bonding the protective layer 13 and the elastic support layer 12. For example, one side of the protective layer 13 is adhered to the second soft adhesive layer 15 so that no relative offset occurs between the elastic support layer 12 and the protective layer 13, and the other side of the protective layer 13 is soft and has micro-elasticity, for example, is made of the foam, the non-viscous colloidal material, etc.

For example, the flexible display panel is the Organic Light-Emitting Diode (OLED) display panel.

The foregoing embodiments merely are exemplary embodiments of the present disclosure, and not intended to define the scope of the present disclosure, and the scope of the present disclosure is determined by the appended claims.

The invention claimed is:

1. A flexible display panel, wherein
the flexible display panel is rollable with respect to a rolling axis and comprises a flexible screen layer and an elastic support layer;
in a first direction perpendicular to a direction of the rolling axis, the flexible screen layer and the elastic support layer are stacked;
the elastic support layer includes a support mechanism and an elastic mechanism, the support mechanism is configured to support the flexible screen layer and is rollable with respect to the rolling axis;
the support mechanism includes a plurality of supporter units that are sequentially arranged in a second direction perpendicular to the direction of the rolling axis, two adjacent supporter units are flexibly connected with each other, and the second direction is perpendicular to the first direction;
the elastic mechanism is a spring leaf, the spring leaf is connected between the two adjacent supporter units in the second direction so as to generate the anti-rolling elastic force to maintain flatness of the flexible screen layer if the flexible screen layer is unrolled, and a cross section, which is perpendicular to the second direction, of the spring leaf is an arc.

2. The flexible display panel according to claim 1, wherein each supporter unit includes a through slot passing through the supporter unit in the second direction, and the spring leaf extends in the second direction to pass through the through slot of each supporter unit.

3. The flexible display panel according to claim 2, wherein
each supporter unit includes only one through slot;
the elastic mechanism includes a plurality of spring leafs, and the plurality of spring leafs extend in the second direction to pass through the only one through slot of each supporter unit.

4. The flexible display panel according to claim 3, wherein a total support reaction force of a spring leaf group constituted by the plurality of spring leafs satisfies:

$$F \propto kR/ph\gamma$$

where, k is a correlation coefficient of each spring leaf, R is a curvature radius of the arc of the spring leaf, $\gamma$ is a radian of a cross section, which is perpendicular to the direction of the rolling axis, of the spring leaf, h is a thickness of each spring leaf, and p is a total number of spring leafs.

5. The flexible display panel according to claim 2, wherein
each supporter unit includes a plurality of through slots;
the elastic mechanism includes a plurality of spring leafs, each spring leaf extends in the second direction, and the plurality of spring leafs respectively pass through the plurality of through slots of each supporter unit.

6. The flexible display panel according to claim 1, wherein
a cross section, which is perpendicular to the direction of the rolling axis, of each supporter unit is trapezoidal;
in a state that the flexible screen layer is unrolled, a short edge and a long edge of the trapezoidal cross section of each supporter unit are respectively parallel to the flexible screen layer, an included angle $\beta$ is between two side edges, close to each other, of the trapezoidal cross-sections of the two adjacent supporter units, and $\beta$ satisfies:

$$\beta > 4\pi/2m_{min} = 2\pi/m_{min}$$

where, m is a number of the supporter units of one winding circle in the case that the flexible display panel is in a wound state, and $m_{min}$ is a number of the supporter units of an innermost winding circle in the case that the flexible display panel is in the wound state.

7. The flexible display panel according to claim 6, wherein in the second direction perpendicular to the direction of the rolling axis, a total number of the plurality of supporter units satisfies:

$$n = (L - \Delta L)/l$$

where, L is a length of the flexible display panel, $\Delta L$ is a loss length of the flexible display panel, and l is a length of the long edge of the trapezoidal cross-section of the supporter unit.

8. The flexible display panel according to claim 1, wherein in the first direction, the flexible screen layer is located on a side of the elastic support layer that is away from the rolling axis.

9. The flexible display panel according to claim 1, further comprising a protective layer provided on a side of the elastic support layer that is away from the flexible screen layer.

10. The flexible display panel according to claim 9, wherein the elastic support layer and the protective layer are bonded together by a second soft adhesive layer.

11. The flexible display panel according to claim 1, wherein the flexible screen layer and the elastic support layer are bonded together by a first soft adhesive layer.

12. A flexible display device, comprising a casing, a rotating shaft and the flexible display panel according to claim 1, wherein the casing is provided with an opening, the rotating shaft is provided within the casing, the rotating shaft is parallel to the rolling axis, and the flexible display panel is rollable with respect to the rotating shaft, and is stretched out of or retracted into the casing through the opening.

13. The flexible display device according to claim 12, wherein the rotating shaft rotates clockwise or counterclockwise;

an edge of the flexible display panel that is parallel to the direction of the rolling axis is fixedly connected with the rotating shaft, so as to implement unrolling or rolling of the flexible display panel when the rotating shaft rotates clockwise or counterclockwise.

14. The flexible display device according to claim 12, further comprising a ratchet mechanism, wherein the ratchet mechanism is provided in the casing and provided on the rotating shaft, and is configured to fix the rotating shaft in the case that the rotating shaft does not need to rotate.

15. The flexible display device according to claim 14, wherein the ratchet mechanism includes a ratchet wheel, a ratchet pawl and a coil spring;

the ratchet wheel is fixed to the rotating shaft by the coil spring, the coil spring is configured for providing a reverse rotary force to the ratchet wheel, the ratchet pawl is fixed to the casing, and a ratchet tooth on the ratchet wheel is engaged with the ratchet pawl under an action of the reverse rotary force.

16. The flexible display device according to claim 15, wherein the casing is provided thereon with a button, the button is connected with the ratchet pawl through a linkage structure; and if the button is pressed down, the linkage structure pushes the ratchet pawl to separate the ratchet pawl from the ratchet tooth on the ratchet wheel.

17. The flexible display device according to claim 14, wherein the ratchet mechanism is provided at an end portion of the rotating shaft, and the flexible display panel is wound around a portion of the rotating shaft except for the end portion provided with the ratchet mechanism.

18. The flexible display device according to claim 14, wherein in addition to the edge of the flexible display panel that is fixedly connected with the rotating shaft, the flexible display panel further comprises three non-fixed edges that are not fixed to the rotating shaft, an outer side of the three non-fixed edges are respectively provided with a barrier wall, and one edge of the three non-fixed edges that is away from the rotating shaft is provided with a stop structure.

\* \* \* \* \*